United States Patent
Schenkl et al.

(10) Patent No.: US 6,706,121 B2
(45) Date of Patent: Mar. 16, 2004

(54) DEVICE AND METHOD FOR THE TREATMENT OF SEMICONDUCTOR WAFERS

(75) Inventors: Manfred Schenkl, Tübingen (DE); Robert Pesce, Reutlingen (DE); John Oshinowo, Hamburg (DE); Uwe Müller, Dresden (DE)

(73) Assignee: Mattson Wet Products (DE)

( * ) Notice: Subject to any disclaimer, the term of this patent is extended or adjusted under 35 U.S.C. 154(b) by 0 days.

(21) Appl. No.: 10/258,559

(22) PCT Filed: Mar. 29, 2001

(86) PCT No.: PCT/EP01/03578

§ 371 (c)(1),
(2), (4) Date: Oct. 23, 2002

(87) PCT Pub. No.: WO01/82337

PCT Pub. Date: Nov. 1, 2001

(65) Prior Publication Data

US 2003/0098043 A1 May 29, 2003

(30) Foreign Application Priority Data

Apr. 25, 2000 (DE) .......................................... 100 20 185

(51) Int. Cl.$^7$ ................................................ C23G 1/02
(52) U.S. Cl. ................................. 134/3; 134/2; 134/10; 134/18; 134/26; 134/27; 134/36; 134/41; 134/56 R; 134/109; 134/186; 134/902; 438/906; 216/84; 216/93; 216/103; 216/104; 216/106; 216/107; 216/108; 216/109
(58) Field of Search .......................... 134/2, 3, 10, 18, 134/26, 27, 36, 41, 56 R, 109, 186, 902; 438/906; 216/84, 93, 103, 104, 106, 107, 108, 109

(56) References Cited

U.S. PATENT DOCUMENTS

| | | | | | |
|---|---|---|---|---|---|
| 5,511,569 | A | * | 4/1996 | Mukogawa | 134/104.1 |
| 5,817,185 | A | * | 10/1998 | Shindo et al. | 134/25.4 |
| 5,839,456 | A | * | 11/1998 | Han | 134/104.1 |
| 6,145,519 | A | * | 11/2000 | Konishi et al. | 134/95.2 |
| 6,284,055 | B1 | * | 9/2001 | Dryer et al. | 134/10 |
| 6,378,534 | B1 | * | 4/2002 | Olesen et al. | 134/1.3 |

FOREIGN PATENT DOCUMENTS

| | | |
|---|---|---|
| DE | 41 00 126 | 7/1992 |
| DE | 41 27 975 | 2/1993 |
| DE | 44 12 896 | 1/1995 |
| DE | 44 13 077 | 10/1995 |
| DE | 197 23 918 | 5/1998 |
| EP | 08-195374 | 7/1996 |
| EP | 0 731 495 | 9/1996 |

OTHER PUBLICATIONS

JP 06–260469, Patent Abstract of Japan Sep. 16, 1994.

JP 07–323274, Patent Abstract of Japan, Dec. 12, 1995.

* cited by examiner

*Primary Examiner*—Randy Gulakowski
*Assistant Examiner*—M. Kornakov
(74) *Attorney, Agent, or Firm*—R W Becker & Associates; R W Becker

(57) ABSTRACT

In a method of treating substrates a treatment fluid is fed into a collection vessel after treatment, at least a portion of the treatment fluid is withdrawn from the collection vessel and returned to respective reservoir and the collection vessel is rinsed before receiving another treatment fluid.

14 Claims, 3 Drawing Sheets

DEVICE AND METHOD FOR THE TREATMENT OF SEMICONDUCTOR WAFERS

BACKGROUND OF THE INVENTION

Figure 1:
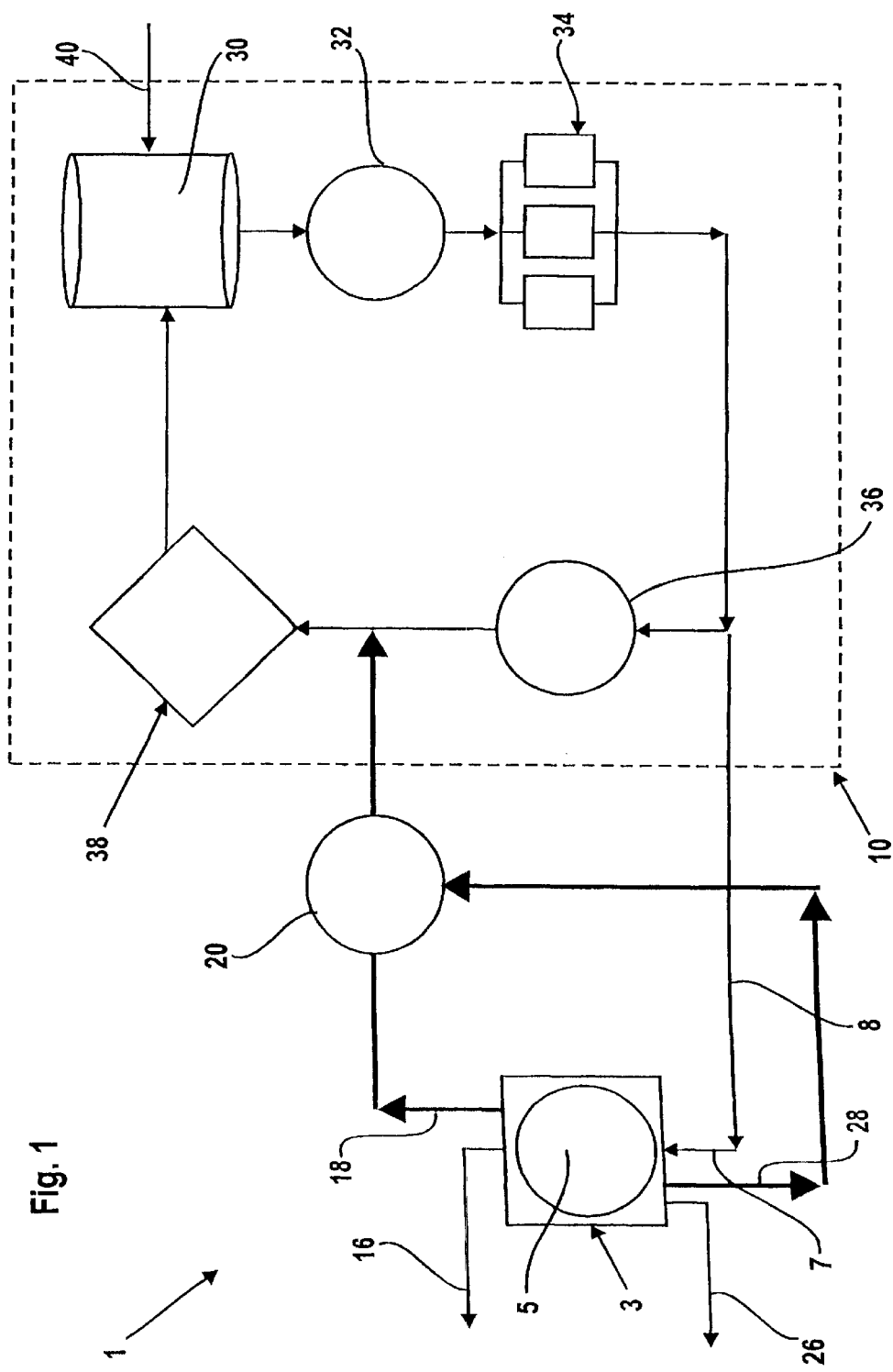

The present invention relates to an apparatus and method for the treatment of semiconductor wafers in a treatment tank into which different treatment fluids are successively introduced from respective receptacles or reservoirs to treat the semiconductor wafers.

In the semiconductor industry, it is known to subject semiconductor wafers to a number of chemical wet treatment steps during the manufacture thereof. According to one known system for the chemical wet treatment of semiconductor wafers, the wafers are treated in different process tanks that each contain different treatment chemicals. The chemicals contained in the process tanks are prepared in preparation units and are used for a plurality of substrates or substrate charges. Unfortunately, such systems are relatively large, since a separate treatment tank is provided for each chemical, which leads to high costs for the system. Furthermore, a flexible adaptation of the process sequences is difficult due to the arrangement of the tanks.

Therefore, in recent times so-called single tank systems or Single-Tank-Tools (STT) were developed with a treatment tank into which different treatment fluids were successively introduced from respective reservoirs for the treatment of the wafers. The advantage of such a system is that only a single treatment tank is provided, which considerably reduces the procurement costs for these units. Furthermore, the base or support surface of the units is considerably reduced, which reduces the operating costs, especially if the units are disposed in clean rooms. Known as reservoirs are chemical tanks in which premixed chemicals are stored prior to the introduction into the treatment tank. Alternatively, it is also possible to mix together the necessary treatment chemicals within the respective reservoirs, and to subsequently introduce them into a treatment tank of the unit.

One such single tank system, which is provided with the features of the introductory portion of claim 18, is known, for example, from applicant's own DE-A-44 13 077. With this single tank system, the treatment chemicals are respectively utilized for one treatment cycle and are subsequently discarded, which leads to a high chemical consumption and thus high cost. Up to now, a reuse of chemicals was not carried out due to the danger of carrying-over of media, which could lead, for example, to crystallization effects.

Proceeding from the above-mentioned state of the art, it is therefore an object of the present invention to reduce the chemical consumption of single tank systems.

SUMMARY OF THE INVENTION

Pursuant to the invention, this object is realized in a method for the treatment of semiconductor wafers in a treatment tank into which different treatment fluids are successively introduced from respective reservoirs for the treatment of the semiconductor wafers, and the treatment fluids are conveyed into a collection vessel after a treatment, in that at least a portion of the treatment fluid is conveyed out of the collection vessel back into the respective reservoir, and the collection vessel is rinsed after the conveying-out of the treatment fluid and prior to receiving a further treatment fluid. Since after the treatment, treatment fluid is first conveyed into a collection vessel, the treatment tank can be rapidly emptied in a conventional manner and subsequently, while the treatment in the treatment tank is continued, the treatment fluid can be conveyed out of the collection vessel back into the respective reservoir in order to prepare and reuse it. The rinsing of the collection vessel between the receipt of different treatment fluids ensures that no carrying-over of media can occur between the treatment fluids.

Pursuant to a preferred embodiment, after each treatment in a treatment fluid the semiconductor wafers are rinsed with a rinsing fluid and subsequently the rinsing fluid is conveyed into the collection vessel, whereby it is cleaned in a simple and economical manner.

The treatment fluids are preferably prepared in the respective reservoirs in order to maintain a uniform quality of the treatment fluid. Pursuant to one particularly straightforward embodiment of the invention, the treatment fluids, especially a treatment fluid containing hydrofluoric acid, are topped off to a prescribed volume with treatment fluid from a supply unit in order to achieve a mixture of used and unused treatment fluid. This method is particularly suitable if a greater portion of the treatment fluid is used up during the treatment, or is lost during the transport between treatment tank and reservoir.

Pursuant to a further embodiment of the invention, during the preparation of the treatment fluid, the volume of at least one treatment fluid in the reservoir is determined, the actual concentration of at least one fluid component of the treatment fluid is determined, a required quantity of the fluid component for achieving a desired concentration thereof in the treatment fluid is calculated, and the calculated quantity of the fluid component is introduced into the treatment fluid. The above-mentioned method ensures that the concentration of certain fluid components in a treatment fluid remains the same over a number of treatment cycles. For the determination of the volume, the treatment fluid in the reservoir is preferably topped off with a known fluid component or treatment fluid from a supply unit to a predetermined volume. The measurement of a fluid volume in a reservoir is relatively complex and imprecise. In contrast, the topping-off to a predetermined volume is very simple and furthermore leads to uniform volumes during the calculation of a required quantity of the fluid component. With greatly diluted chemicals, which to a large extent are comprised of water, the treatment fluid is preferably topped off with water as one of the fluid components. Alternatively, treatment fluid can also be introduced from a supply unit in order to reach the predetermined volume.

The concentrations of the fluid components are preferably measured a number of times, and the average value of the measurement is used for the calculation.

The quantities of the required fluid components are preferably calculated with the aid of the following equation:

$$V_{fk} = \frac{(K_{des} - K_{act}) * V_{bf} * D_{bf} * 1000 *}{D_{fk} * K_{fk}}$$

where,
$V_{fk}$=Volume of the required fluid component in ml
$K_{des}$=Desired concentration of the fluid component (in % by weight)
$K_{act}$=Actual concentration of the fluid component (in % by weight)
$V_{bf}$=Volume of the treatment fluid in l
$D_{bf}$=Density of the treatment fluid in g/ml
$D_{fk}$=Density of the fluid component in g/ml
$K_{fk}$=Concentration of the fluid component (in % by weight).

For an improved quality, the actual concentration of the fluid component after the introduction of the calculated quantity of the fluid component into the treatment fluid is again measured, and if the actual concentration deviates from the desired concentration, a renewed calculation and introduction is carried out.

Pursuant to one embodiment of the invention, the treatment fluids are displaced out of the processing tank by introducing some other fluid, especially a rinsing fluid, and are conveyed into a collection vessel. This method has the advantage that the semiconductor wafers are continuously covered with a fluid, and are not exposed to the ambient air between different treatment fluids. Furthermore, with this method there results the advantage of a uniform treatment of the semiconductor wafers, since every point of the substrate is retained within the treatment fluid for essentially the same period of time. Due to a partial mixing of the treatment fluid and the other fluid, the entire treatment fluid cannot be recovered, so that media losses occur.

Pursuant to an alternative embodiment of the invention, the treatment fluids are discharged from the processing tank via a rapid discharge valve and are conveyed into a collection vessel. With this method, essentially the entire treatment fluid can be recovered; however, after the discharge of the treatment fluid the semiconductor wafer is initially exposed to the ambient air.

The treatment fluid is preferably circulated in the reservoir in order to achieve a good and uniform mixing of the components of the treatment fluid. In this connection, the treatment fluid is preferably filtered in the reservoir in order to filter out particles that are contained in the treatment fluid and that could adversely affect the treatment of the semiconductor wafers. For a respectively uniform treatment of the semiconductor wafers, the treatment fluid in the reservoir is preferably brought to a prescribed temperature, since the temperature can have a considerable influence upon the success of the treatment. Pursuant to the present invention, at least one treatment fluid contains $NH_4OH$, $H_2O_2$, HCl or a combination of at least two of the preceding components, hydrofluoric acid (HF), and/or a sulfur/peroxide mixture (SPM).

The object of the present invention is realized by an apparatus for the treatment of semiconductor wafers, in a treatment tank, with a first valve unit for the introduction of different treatment fluids from different reservoirs into the treatment tank, and at least one collection vessel for collecting the treatment fluid after a treatment, in that a second valve unit is provided for the introduction of at least a portion of the treatment fluid out of the collection vessel into the respective reservoir, and a rinsing unit is provided for the rinsing of the collection vessel. The apparatus has the advantages already mentioned above in conjunction with the method.

The treatment tank preferably has a rapid discharge valve and a collection vessel below the treatment tank or a collection vessel that is embodied as an overflow collar of the treatment tank. If the overflow collar has a relatively small volume, a controllable connection line is preferably provided between the overflow collar and the collection vessel disposed below the treatment tank in order to provide an adequate collection volume for the treatment fluid that is flowing out of the treatment tank. The rinsing unit preferably has at least one fluid nozzle in the collection vessel in order to clean the collection vessel between the receipt of different treatment fluids.

BRIEF DESCRITPION OF THE DRAWINGS

Figure 2:
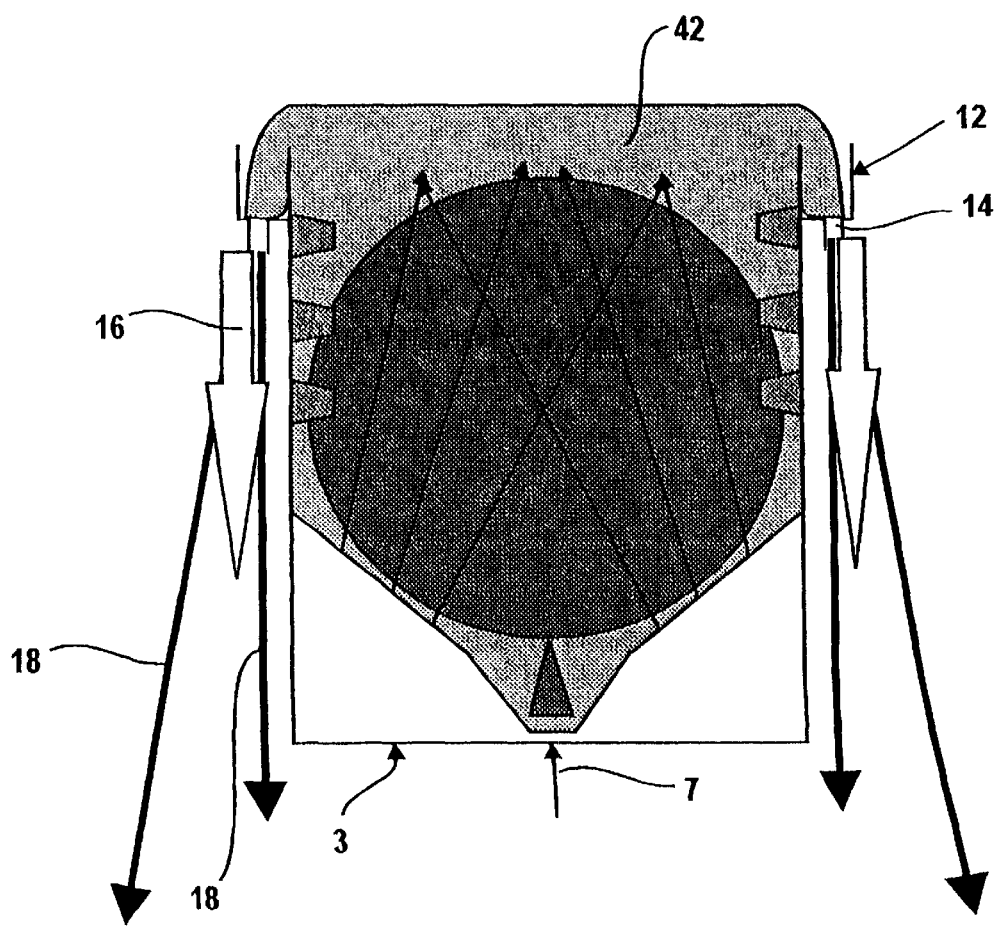
Figure 3:
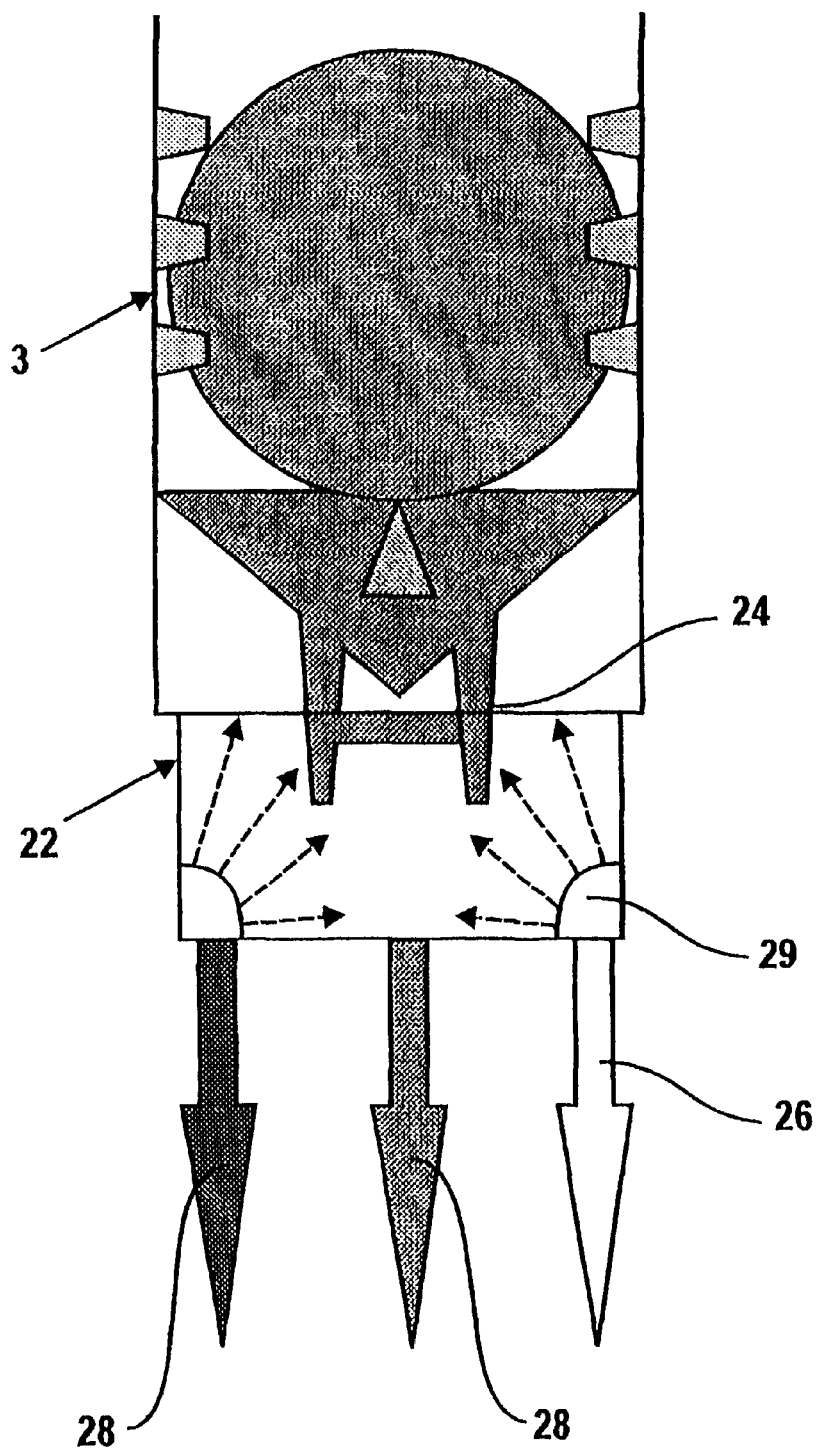

The invention will be explained subsequently with the aid of preferred embodiments in conjunction with the drawings, which show:

FIG. 1 schematically the arrangement of a semiconductor treatment unit pursuant to the present invention;

FIG. 2 schematically the composition of a treatment tank having a treatment fluid displacement mechanism;

FIG. 3 schematically the composition of a treatment tank having a rapid discharge valve.

FIG. 1 schematically shows the arrangement of a treatment unit 1 pursuant to the present invention. The treatment unit 1 is provided with a treatment tank 3 for semiconductor wafers 5. The treatment tank 3 has an inlet line 7 that via a valve mechanism communicates with a plurality of outlet lines 8 of various reservoirs 10 for chemicals. In FIG. 1, only one outlet line 8 and one reservoir 10 are illustrated, although a number of lines and reservoirs are provided.

As will be discussed in greater detail subsequently with reference to FIG. 2, the treatment tank 3 is provided with an overflow collar 12 having an outlet 14. A valve unit in the outlet 14 is in a position to connect the overflow with a discharge line 16 or with one of a plurality of return lines 18, each of which is in communication with one of the reservoirs 10. Provided in each of the return lines 18 is a pump 20 in order, if desired, to pump treatment fluid out of the overflow collar 12 to one of the reservoirs 10.

Alternatively, or also in addition to the overflow collar 12, the treatment tank 3 is provided with a collection vessel 22 that is disposed below the treatment tank, as shown in FIG. 3. In order to be able to discharge treatment fluid out of the treatment tank 3, a rapid discharge valve 24 is provided. The collection vessel is provided with a discharge line that is not illustrated in detail and that has a valve unit that connects the collection vessel 22 with a discharge line 26 or with one of a plurality of return lines 28. Each of the return lines 28 is connected via a pump 20 with one of the reservoirs 10 in order to enable transport of treatment fluid out of the collection vessel 22 to the respective reservoir 10. Provided in the collection vessel is an inlet nozzle 29 via which, as will be described in greater detail subsequently, a rinsing fluid is introduced into the collection vessel.

Each of the reservoirs 10 is provided with a mixing vessel 30, a pump 32, a filter unit 34, a temperature-setting device 36, and a concentration measuring device 38. The reservoir 10 is furthermore provided with a volume-determining unit, which is not shown in greater detail, as well as a control unit. The volume-determining unit is provided with a filling-level sensor in the mixing vessel 30. The treatment fluid volume in the pump 32, the filter unit 34, the temperature-setting device 36, the concentration measuring device 38, and the respective connecting lines between such units is known. In this connection, the volume in the mixing vessel 30 is preferably considerably greater than the volume in the other units of the reservoir 10. By measuring the fluid level in the mixing vessel 30, it is therefore possible to determine the overall volume of treatment fluid in the reservoir 10.

Instead of a filling-level sensor that can measure different fluid levels in the mixing vessel 30, it is also possible to fill the mixing vessel 30 via a feed line 40 to a predetermined fluid level that is sensed and indicated by a sensor. By means of the feed line 40, premixed treatment fluid or single fluid components can be introduced.

The pump 32 circulates the treatment fluid through the various components of the reservoir 10 to obtain a uniform mixture of the treatment fluid. The filter unit 34 filters undesired particles out of the treatment fluid. The temperature-setting device sets (i.e. cools or heats) the temperature of the treatment fluid to a pre-selected operating temperature. The operating temperature is prescribed by the control device for the respective treatment fluid.

The concentration measuring device 38 measures the actual concentration of one or more fluid components of the treatment fluid, and conveys the measured actual concentration to the control device. The control device is in a position, as will be described in greater detail subsequently, to calculate a required volume of a fluid component to achieve a predetermined concentration in the treatment fluid.

The operation of the apparatus 1 will be explained in greater detail subsequently with the aid of the drawings.

A wafer 5, or a batch of wafers 5, is first introduced via a known handling device into the treatment tank, which is filled with deionized water (DIW). The DI water is subsequently discharged via the rapid discharge valve 24 into the collection vessel 22, and subsequently into the discharge line 26. Prior to the discharge, the wafers are raised into a so-called rapid discharge position, and after the complete discharge of the DI water are moved back into their starting position. The complete discharge of the DI water is determined by an appropriate sensor. Alternatively, a predetermined period of time can be provided for the discharge of the DI water.

The treatment tank is subsequently filled with a first treatment fluid, such as, for example, buffered hydrofluoric acid (BHF), from one of the reservoirs 10. Prior to the filling of the BHF into the treatment tank 3, the BHF is premixed in the reservoir 10, is circulated, and is brought to a desired temperature. To ensure a splash-free filling of the BHF fluid, at the beginning of the filling a low flow rate is selected, which is subsequently increased. The treatment tank is filled to a certain level at which the wafers are completely covered with treatment fluid. The introduction of the treatment fluid is terminated, and is circulated via a suitable circulation unit in the treatment tank. Alternatively, the treatment fluid can also be statically held in the tank, i.e. without circulation, or by further introduction of the treatment fluid can be brought to overflow into the overflow collar 12. The treatment fluid can then be selectively conveyed out of the overflow collar 12 to the discharge line 16 or the return line 18.

After expiration of a specified treatment time, the BHF fluid is discharged into the collection vessel 22 via the rapid discharge valve 24. The rapid discharge valve 24 is closed, and the treatment tank is rapidly filled with a rinsing fluid, such as, for example, DIW, until it overflows into the overflow collar 12. The DIW is conveyed out of the overflow collar 12 into the discharge line 16. The BHF fluid collected in the collection vessel 22 is returned via an appropriate one of the return lines 28 and the pump 20 to the reservoir 10 for BHF. As will be discussed in greater detail subsequently, the BHF fluid is processed or prepared in the reservoir 10.

For the further treatment of the wafers 5, the DI water is withdrawn via the rapid discharge valve 24 into the collection vessel 22, and subsequently into the discharge 26. In so doing, the DI water at least partially rinses the collection vessel 22. The rapid discharge valve 24 is closed, and a new treatment fluid, such as, for example, SC1, which is a mixture of $H_2O_2$, $NH_4OH$, and water, or SC2, which is a mixture of $H_2O_2$, HCl, and water, is conveyed from one of the reservoirs 10 into the treatment tank 3. When a specified volume is reached, the introduction is halted and the treatment fluid is circulated in the treatment tank. After expiration of a specified treatment time, the SC1 or SC2 fluid is discharged from the treatment tank 3 in the same manner as the BHF fluid, and is conveyed back to the appropriate reservoir 10. In the manner described above, the wafers can be subjected to various treatment fluids that after termination of a treatment stage are respectively returned to their respective reservoir. Between the respective treatment stages, the wafers are rinsed with a rinsing fluid, such as, for example, DI water, which is subsequently also used to rinse the collection vessel 22.

Instead of discharging the respective fluids from the treatment tank 3 via the rapid discharge 24, it is also possible to displace the fluids by introducing the next fluid. For the above-described sequence, this means that the DI water initially found in the treatment tank is displaced out of the treatment tank into the overflow collar 12 by introduction of the BHF fluid. In so doing, the BHF fluid is introduced for a prescribed introduction period and at a prescribed flow rate. In this connection, an introduction of the BHF fluid that is as symmetrical and rapid as possible is selected. The wafers remain in a fluid environment the entire time, and the displacement is effected more rapidly than the discharge and renewed introduction of fluids, as a consequence of which a high throughput results for the unit. From the overflow collar 12, the displaced DI water is conveyed to the discharge line 16. After the expiration of the introduction period, the BHF fluid is circulated in the treatment tank 3 for a specified treatment time. After expiration of the treatment time, the BHF fluid is displaced out of the treatment tank 3 into the overflow collar 12 by introduction of DI water. From the overflow collar 12, the displaced BHF fluid is conveyed back to the BHF reservoir 10 via an appropriate return line 18. Since during the displacement of the BHF fluid a mixing with the DI water occurs, only the first portion of the BHF fluid displaced out of the treatment tank 3 is conveyed back to the reservoir 10. After a specified displacement period, the outlet 14 of the overflow collar 12 is therefore opened to the discharge line 16 in order to convey away the remaining BHF fluid and the mixture of BHF fluid and DI water.

The above method is repeated for the subsequent treatment fluids, such as, for example, SC1 and SC2.

Instead, as described above, of directly conveying the displaced treatment fluid, such as, for example, the BHF fluid, out of the overflow collar 12 into the reservoir 10, it is also possible to initially convey the fluid into the collection vessel 22, which makes possible a more rapid discharge of the fluid out of the overflow collar. After expiration of a specified displacement time, or after achieving a specified filling height within the collection vessel, the connection to the collection vessel is closed and the remaining fluid in the overflow collar 12 is conveyed into the discharge line 16. It is, of course, also possible to convey some of the fluids out of the treatment tank via the rapid discharge, and to convey other fluids out by displacement.

The preparation of the treatment fluids in the respective reservoirs 10 will be described in greater detail in the following.

In the BHF reservoir, the volume of the BHF fluid is determined. For this purpose, a stationary filling level sensor is provided in the mixing vessel 30. If the filling level sensor is not active, i.e. the fluid level is below the filling level sensor, premixed BHF fluid is introduced via the feed line 40 until the filling level sensor is reached. The BHF fluid is subsequently circulated in the reservoir 10, is filtered, and is brought to the treatment temperature. If necessary, the BHF fluid can subsequently be returned to the treatment tank. With this method, the concentration measuring device in the reservoir 10 is not needed.

Pursuant to an alternative preparation method, which is preferably used for SC1 and SC2, initially the volume of the fluid in the reservoir is again determined. For this purpose, a fixed filling level sensor is again provided in the mixing vessel 30 of the reservoir 10. If the fluid level is above the fixed filling level sensor, the fluid is discharged from the reservoir via an appropriate outlet. If, on the other hand, the fluid level is below the filling level sensor, either premixed treatment fluid or a specified fluid component, such as, for example, water, is introduced into the mixing vessel 30 via the feed line 40 until the filling level sensor is reached. The fluid is subsequently circulated in the reservoir 10 and in so doing is filtered and the temperature is set. In the concentration measuring device 38, the concentrations of fluid components are determined and are conveyed to the control unit for the reservoir 10.

With the aid of the determined values, the control unit calculates the required volumes of the single fluid components in order to achieve a desired concentration of the components in the fluid. In this connection, the control unit utilizes the following equation:

$$V_{fk} = \frac{(K_{des} - K_{act}) * V_{bf} * D_{bf} * 1000 *}{D_{fk} * K_{fk}}$$

where, $V_{fk}$=Volume of the required fluid component in ml
$K_{des}$=Desired concentration of the fluid component (in % by weight)
$K_{act}$=Actual concentration of the fluid component (in % by weight)
$V_{bf}$=Volume of the treatment fluid in l
$D_{bf}$=Density of the treatment fluid in g/ml
$D_{fk}$=Density of the fluid component in g/ml
$K_{fk}$=Concentration of the fluid component (in % by weight).

An appropriate volume of the single fluid components is now introduced into the mixing vessel via the feed line 40. After a specified circulation time, in which a good mixing of the fluid components is achieved, a renewed measurement of the concentration is subsequently undertaken. If a deviation of the actual concentration from the desired concentration is above a predetermined threshold, a renewed calculation and introduction is carried out for the respective fluid components.

The invention was previously explained in detail with the aid of preferred embodiments of the invention, without, however, being limited to the concrete embodiments. Thus, for example, the present invention is not limited to the above described treatment fluids. For example, a treatment of the wafers can be effected in a sulfur/peroxide mixture prior to the BHF treatment. Instead of BHF, a diluted hydrofluoric acid (DHF) can also be used. A further common treatment fluid is, for example, $H_2SO_4$, which is commonly used between a BHF treatment and an SC1 treatment. After termination of the treatment in the treatment tank, the wafers can be dried, for example pursuant to the Marangoni process. The treatment, and in particular the rinsing, of the substrates can be enhanced by the introduction of high-frequency sound waves as well as by moving the wafers up and down.

The specification incorporates by reference the disclosure of German priority document 100 20 185.7 filed Apr. 25, 2000 and International priority document PCT/EP01/03578 filed Mar. 29 2001.

The present invention is, or course, in no way restricted to the specific disclosure of the specification and drawings, but also encompasses any modifications within the scope of the appended claims.

What is claimed is:

1. A method of treating semiconductor wafers in a treatment tank into which different treatment fluids are successively introduced from respective reservoirs to treat said wafers, said method including the steps of:
    after a treatment with a treatment fluid, conveying said treatment fluid into a collection means;
    conveying at least a portion of said treatment fluid out of said collection means and to a respective reservoir;
    thereafter rinsing said collection means prior to conveying a subsequent treatment fluid to said collection means.

2. A method according to claim 1, wherein after each treatment in a treatment fluid, rinsing said wafers with a rinsing fluid; and after said rinsing of said wafers conveying said rinsing fluid into said collection means.

3. A method according to claim 1, which includes the step of preparing said treatment fluids in said respective reservoirs.

4. A method according to claim 3, wherein a treatment fluid, is topped off to a prescribed volume with treatment fluid from a supply unit.

5. A method according to claim 3, which includes the further steps of:
    determining the volume of at least one treatment fluid in a reservoir;
    determining the actual concentration of at least one fluid component of said treatment fluid;
    calculating a required quantity of said fluid component to achieve a desired concentration thereof in said treatment fluid; and
    introducing the calculated quantity of said fluid component into said treatment fluid.

6. A method according to claim 5, wherein to determine said volume, said treatment fluid is said reservoir is topped off to a prescribed volume with a known fluid component or treatment fluid from a supply unit.

7. A method according to claim 5, wherein said concentration of said fluid component is measured several times, and an average value of the measurements is used for said calculation.

8. A method according to claim 5, wherein said quantity of required fluid component is calculated with the aid of the following equation:

$$V_{fk} = \frac{(K_{des} - K_{act}) \times V_{bf} \times D_{bf} \times 1000}{D_{fk} \times K_{fk}}$$

where, $V_{fk}$=Volume of the required fluid component in ml
$K_{des}$=Desired concentration of the fluid component (in % by weight)
$K_{act}$=Actual concentration of the fluid component (in % by weight)
$V_{bf}$=Volume of the treatment fluid in l
$D_{bf}$=Density of the treatment fluid in g/ml
$D_{fk}$=Density of the fluid component in g/ml
$K_{fk}$=Concentration of the fluid component (in % by weight).

9. A method according to claim 5, wherein after the introduction of the calculated quantity of the fluid component into the treatment fluid, again determining the actual concentration of the fluid component, and if the actual concentration deviated from the desired concentration, effecting the recalculation and introduction for the fluid component.

10. The method according to claim 1, wherein a rinsing fluid is introduced into said treatment tank to displace said treatment fluid out of said treatment tank, and wherein said displaced treatment fluid is conveyed into said collection means.

11. A method according to claim 1, wherein said treatment fluid is discharged from said treatment tank via a rapid discharge valve and is conveyed into said collection means.

12. A method according to claim 1, wherein said treatment fluid in said reservoir is subjected to at least one of the steps of circulating said treatment fluid, filtering said treatment fluid, and bringing said treatment fluid to a prescribed temperature.

13. A method according to claim 1, wherein at least one treatment fluid contains $NH_4OH$, $H_2O_2$, HCl or a combination of at least two of said components.

14. A method according to claim 1, wherein at least one treatment fluid contains hydrofluoric acid or a sulfuric acid/peroxide mixture.

* * * * *

UNITED STATES PATENT AND TRADEMARK OFFICE
CERTIFICATE OF CORRECTION

PATENT NO.    : 6,706,121 B2
DATED         : March 16, 2004
INVENTOR(S)   : Schenkl et al.

It is certified that error appears in the above-identified patent and that said Letters Patent is hereby corrected as shown below:

<u>Title page,</u>
Item [54], should read as follows:
-- [54] Title APPARATUS AND METHOD FOR THE TREATMENT OF SEMICONDUCTOR WAFERS --.

Signed and Sealed this

Eighteenth Day of May, 2004

JON W. DUDAS
*Acting Director of the United States Patent and Trademark Office*